(12) United States Patent
White et al.

(10) Patent No.: US 7,799,644 B2
(45) Date of Patent: Sep. 21, 2010

(54) TRANSISTOR WITH ASYMMETRY FOR DATA STORAGE CIRCUITRY

(75) Inventors: Ted R. White, Austin, TX (US); James D. Burnett, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 646 days.

(21) Appl. No.: 11/460,782

(22) Filed: Jul. 28, 2006

(65) Prior Publication Data
US 2008/0026529 A1 Jan. 31, 2008

(51) Int. Cl.
*H01L 21/8234* (2006.01)
*H01L 21/44* (2006.01)

(52) U.S. Cl. .............. 438/275; 438/682; 257/E21.634; 257/E21.636

(58) Field of Classification Search .......... 438/655, 438/275, 682; 257/E21.636, E21.634
See application file for complete search history.

(56) References Cited

U.S. PATENT DOCUMENTS

| | | | |
|---|---|---|---|
| 5,659,194 | A | 8/1997 | Iwamatsu et al. |
| 5,751,640 | A | 5/1998 | Gil |
| 5,985,707 | A | 11/1999 | Gil |
| 6,004,849 | A | 12/1999 | Gardner et al. |
| 6,020,242 | A | 2/2000 | Tsai et al. |
| 6,051,494 | A | 4/2000 | Iwamatsu et al. |
| 6,294,434 | B1 * | 9/2001 | Tseng ................. 438/303 |
| 6,319,805 | B1 | 11/2001 | Iwamatsu et al. |
| 6,649,976 | B2 | 11/2003 | Iwamatsu et al. |
| 6,697,283 | B2 | 2/2004 | Marotta et al. |
| 6,767,770 | B1 * | 7/2004 | Horch et al. ........... 438/133 |
| 6,916,716 | B1 | 7/2005 | Goad et al. |
| 6,969,678 | B1 | 11/2005 | Chiu et al. |
| 6,974,737 | B2 | 12/2005 | Snyder et al. |
| 6,987,061 | B2 | 1/2006 | Mehrotra |

(Continued)

FOREIGN PATENT DOCUMENTS

JP 07-221297 1/1994

(Continued)

OTHER PUBLICATIONS

International Search Report and Written Opinion relating to PCT/US2007/068086, Applicant's file reference MT10280TP, dated Apr. 10, 2008.

(Continued)

*Primary Examiner*—Alexander G Ghyka
*Assistant Examiner*—Seahvosh J Nikmanesh
(74) *Attorney, Agent, or Firm*—Kim-Marie Vo

(57) ABSTRACT

A transistor having a source with higher resistance than its drain is optimal as a pull-up device in a storage circuit. The transistor has a source region having a source implant having a source resistance. The source region is not salicided. A control electrode region is adjacent the source region for controlling electrical conduction of the transistor. A drain region is adjacent the control electrode region and opposite the source region. The drain region has a drain implant that is salicided and has a drain resistance. The source resistance is more than the drain resistance because the source region having a physical property that differs from the drain region.

17 Claims, 13 Drawing Sheets

U.S. PATENT DOCUMENTS

| | | | |
|---|---|---|---|
| 7,166,897 | B2 | 1/2007 | Orlowski et al. |
| 2002/0048919 | A1 | 4/2002 | Iwamatsu et al. |
| 2003/0211684 | A1* | 11/2003 | Guo .......................... 438/230 |
| 2003/0218218 | A1 | 11/2003 | Chaudhry et al. |
| 2005/0042831 | A1 | 2/2005 | Mehrotra |
| 2005/0148114 | A1 | 7/2005 | Rhodes |
| 2005/0287730 | A1 | 12/2005 | Snyder et al. |
| 2006/0014331 | A1 | 1/2006 | Tang et al. |
| 2006/0040450 | A1 | 2/2006 | Hsu |
| 2006/0043498 | A1 | 3/2006 | Orlowski et al. |
| 2007/0064494 | A1* | 3/2007 | Morton et al. ......... 365/185.28 |

FOREIGN PATENT DOCUMENTS

| | | |
|---|---|---|
| JP | 09-223749 | 12/1996 |
| KR | 10-2007-0005186 | 10/2007 |

OTHER PUBLICATIONS

Miyamoto M et al., "An Asymmetrically Doped Buried-Layer (ADB) Structure for Low-Voltage Mixed Analog-Digital CMOS LSI's", IEEE Transactions on Electron Devices, vol. 46, No. 8, Aug. 1999, pp. 1699-1704 Abstract, figure 7, p. 1703, see "Conclusions".

Akinwande et al., An Asymmetrical Lightly Doped Drain (LDD) Self-Aligned Gate Heterostructure Field Effect Transistor, Bloomington, MN 55420, IEEE Transactions on Electron Devices, vol. 35, No. 12, Dec. 1988.

H. S. Yang, Dual Stress Liner for High Performance sub-45nm Gate Length SOI CMOS Manufacturing.

Shinyaito, Mechanical Stress Effect of Etch-Stop Nitride and its Impact on Deep Submicron Transistor Design.

S.J. Ahn, G.T. Jung, C.H. Cho, S.H. Shin, J.Y. Lee, J.G. Lee, H.S. Jeong, and Kinam Kim, Novel DRAM Cell Transistor with Asymmetric Source and Drain Junction Profiles Improving Data Retention Characteristics, 2002 Symposium on VLSI Technology of Technical Papers, pp. 176-177.

T. Ghani, K. Mistry, P. Packan, M. Armstrong, S. Thompson, S. Tyagi, and M. Bohr, Asymmetric Source/Drain Extension Transistor Structure for High Performance Sub-50nm Gate Length CMOS Devices, 2001 Symposium on VLSI Technology Digest of Technical Papers, pp. 17-18.

B. Aldridge, N. Sharif, E. Yum, F. Serhan, Detection and Measurement of Hot Carrier Degradation Associated with Asymmetric P-Channel Transistors, 95 IRW Final Report, pp. 66-71 .

Jakub Kedzierski, Meikei Ieong, Thomas Kanarsky, Ying Zhang and H.-S Philip Wong, Fabrication of Metal Gated FinFETs Through Complete Gate Silicidation With Ni, IEEE Transactions on Electron Devices, vol. 51, No. 12, Dec. 2004, pp. 2115-2120.

X.W. Lin, M. Weling, and D. Pramanik, A Dual Salicide Process Scalable to Sub-0.25-um CMOS Technologies, 1998 IEEE, IITC 98-93-98-95.

* cited by examiner

US 7,799,644 B2

TRANSISTOR WITH ASYMMETRY FOR DATA STORAGE CIRCUITRY

FIELD OF THE INVENTION

This invention relates generally to semiconductor devices, and more specifically, to transistors with asymmetry for data storage circuitry.

BACKGROUND

Increasingly lower-power semiconductor structures are needed to reduce power requirements of integrated circuits, such as memory devices. Memory devices, such as SRAMs (Static Random Access Memories), are typically implemented using bitcells, whose performance is a function of many parameters including semiconductor techniques used to implement the bitcells. SRAM bit cell functionality and performance, among other things, depends on the write margin of the bit cell. Higher write margin enables one to change the state of a bit cell using a lower voltage. Lower voltage correspondingly results in lower power consumption by the bit cell and thus the memory using the bit cell. However, conventional memory devices require higher voltage to perform a state change of the bit cell resulting in higher power consumption. Thus, there is a need for an improved transistor structure that results in a higher write margin for bitcells without degrading read performance for memory devices, such as SRAMs.

BRIEF DESCRIPTION OF THE DRAWINGS

The invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the invention.

DETAILED DESCRIPTION OF THE DRAWINGS

Figure 1:
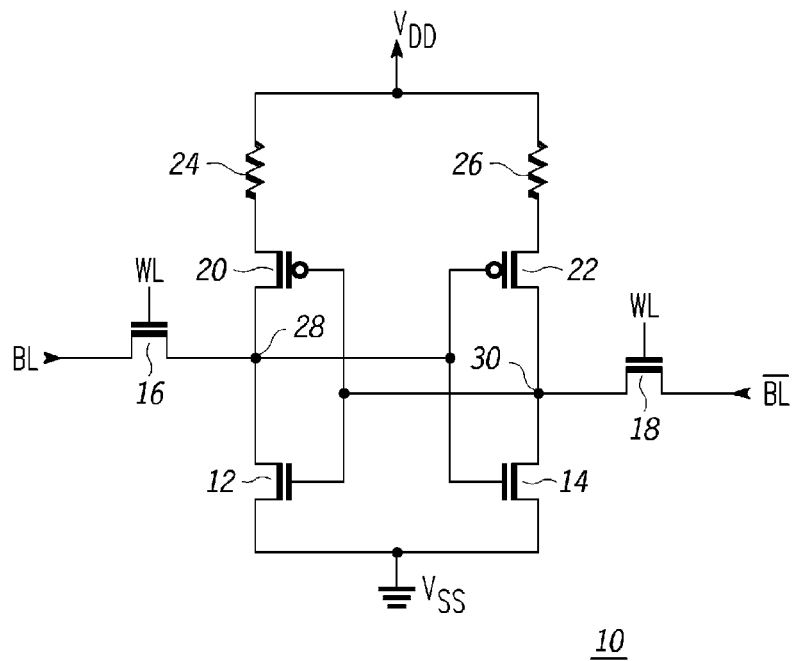
FIG. 1 illustrates a schematic of data storage circuitry in accordance with an embodiment of the invention.

FIG. 1 illustrates a SRAM cell 10, which is one embodiment of data storage circuitry. Other embodiments include other memory cells, such as a NVM (non-volatile memory) cell or DRAM (dynamic random access memory) cell. In the embodiment illustrated, the SRAM cell 10 includes six transistors 12, 14, 16, 18, 20 and 22. Transistors 12 and 14 are latch transistors, such as pull-down NMOS transistors coupled to Vss. Transistors 16 and 18 are pass gate NMOS transistors and are both coupled to WL. Pass gate NMOS transistor 16 is also coupled to BL, while pass gate NMOS transistor 18 is coupled to BL bar. Pass gate NMOS transistor 16 is also coupled to storage node 28 and transistor 18 is also coupled to complementary storage node 30. Transistors 20 and 22 are load transistors, which in one embodiment are pull-up PMOS transistors. Resistors 24 and 26 are coupled to Vdd and to load transistors 20 and 22. Resistors 24 and 26 are schematic representations of the modification made herein to the load transistors 20 and 22. The resistors 24 and 26 increase the resistance of the source regions of the load transistors 20 and 22. By increasing the resistance of the source regions, the resistance between the PMOS source and Vdd is increased, which improves the write Vmin. As will be better understood after further explanation, when the resistance of the source regions is increased, the read Vmin for resistance values of approximately 1,000 Ohm-micron is not degraded, Vt (threshold voltage) is not substantially changed, and the cell size may not be substantially increased.

The source resistance is a combination of various resistances: the overlap resistance, the extension resistance, the (deep) source/drain resistance and the contact resistance. Any of the resistances or combinations of the resistances can be increased to increase the overall source resistance. Below are various ways to increase the source resistance. Any of the embodiments can be combined with one or more of the other embodiments.

Figure 2:
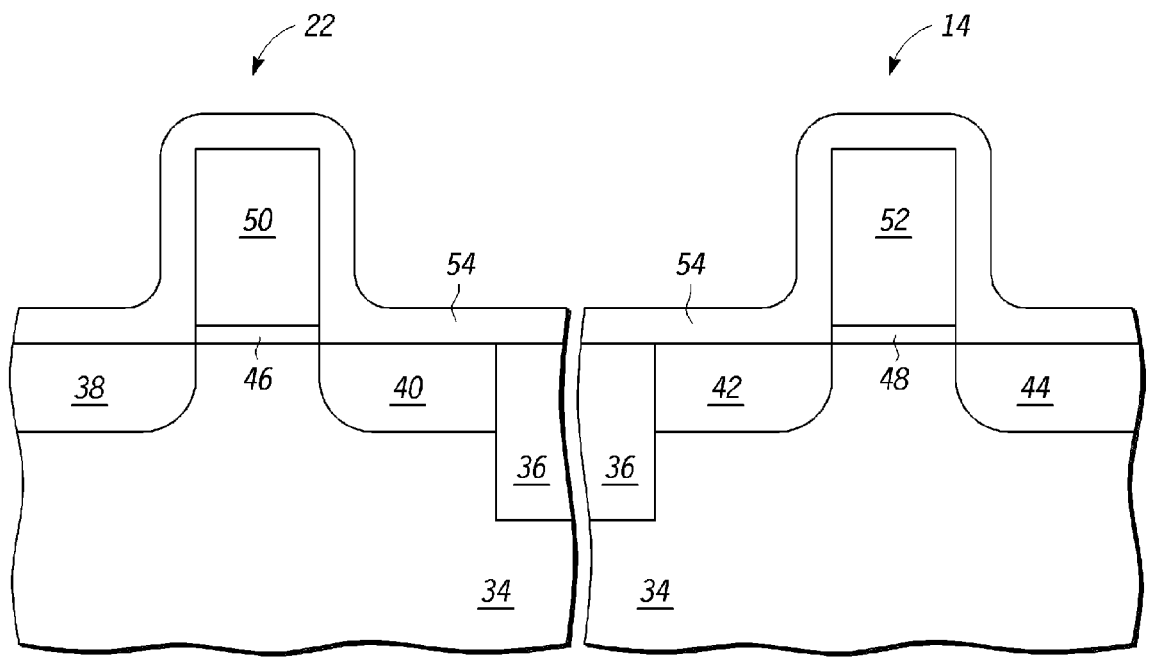
FIG. 2 illustrates a cross-section of a portion of a semiconductor device having a spacer material layer in accordance with an embodiment of the invention.

FIG. 2 illustrates complementary transistors 32, which for example include the load transistor 22, which in the embodiment illustrated is a PMOS transistor, and the latch transistor 14, which in the embodiment illustrated in an NMOS transistor, at a stage in manufacturing. A skilled artisan should recognize that the load transistor 22 and the latch transistor 14 may not be in the same plane in cross-section, as illustrated by the squiggly line bisecting some of the elements. Thus, the load transistor 22 and the latch transistor 14 are illustrative transistors and instead, any other PMOS and NMOS transistor could be shown and hence will be referred to as PMOS transistor 22 and NMOS transistor 14.

The complementary transistors 32 include a substrate 34. The substrate 34 may be a metal, a semiconductor substrate, the like or combinations of the above. In a preferred embodiment, the substrate is a semiconductor substrate 34 and includes an isolation region 36, such as a shallow trench isolation region. The semiconductor substrate 34 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. As will be further understood, if a silicide is to be formed over source or drain regions the semiconductor substrate includes silicon. A silicide need not be formed in all the embodiments over the substrate 34 even if it is illustrated in the figures.

At this point in manufacturing, the PMOS transistor 22 includes a source extension 38 and a drain extension 40 within the substrate 34 and spaced apart a distance that is approximately equal to the width of a gate electrode 50. The source extension 38 and the drain extension 40 are doped p-type. The PMOS transistor 22 also includes at this point, a gate dielectric 46 over the substrate 34 and the gate electrode 50 overlying the gate dielectric 46. In one embodiment, the gate dielectric 46 may be silicon dioxide, a high dielectric constant (high-k or hi-k) material (e.g., $HfO_2$, $Hf_xZr_{1-x}O_2$, or $Hf_xZr_yO_z$), nitrided silicon dioxide, the like, or combinations of the above. The high-k material has a dielectric constant greater than that of silicon dioxide. The gate dielectric 46 can be formed by any suitable process such as thermal growth, chemical vapor deposition (CVD), atomic layer deposition (ALD), physical vapor deposition (PVD), the like, or combinations of the above followed at some point by a patterning process.

In one embodiment, the gate electrode 50 may include silicon (e.g., polysilicon) or include a metal (e.g., tantalum carbide, tantalum silicon nitride, tantalum nitride, titanium nitride, tantalum carbide alloyed with another metal, molybdenum, molybdenum nitride, the like, or combinations of the above.) As will be understood after further explanation, a salicide will be formed over the gate electrode 50 if it includes silicon. However, if the gate electrode 50 does not include silicon, a salicide will not be formed over the gate electrode 50. Thus, in the embodiments shown where salicide is formed over the gate electrode 50, in the illustrated embodiments the gate electrode 50 includes silicon. However, the gate electrode 50 does not need to include silicon. In these non-illustrated embodiments, a salicide is not formed over the gate electrode 50 unless a layer including silicon is formed over the gate electrode 50. The gate electrode 50 can be formed by any suitable process, such as CVD, ALD, PVD, sputtering, the like, or combinations of the above followed at some point by a patterning process.

At this point in manufacturing, the NMOS transistor 14 includes a source extension 42 and a drain extension 44 within the substrate 34 and spaced apart a distance that is approximately equal to the width of a gate electrode 52. The source extension 42 and the drain extension 44 are doped n-type using conventional doping conditions and processes. The NMOS transistor 14 also includes at this point, a gate dielectric 48 over the substrate 34 and the gate electrode 52 overlying the gate dielectric 48. The gate dielectric 48 and the gate electrode 52 can be any material and be formed by any process discussed for the gate dielectric 46 and the gate electrode 50.

A spacer material layer 54 is formed over the substrate 34 (and the gate electrodes 50 and 52), as shown in FIG. 2. The spacer material layer 54 may be a nitride material, such as silicon nitride, a dielectric material, such as silicon oxide or another oxide material, the like or combinations of the above. The spacer material layer 54 can be formed by any suitable process, such as CVD. The spacer material layer 54, in one embodiment, is approximately 10 to approximately 100 nanometers thick.

Figure 3:
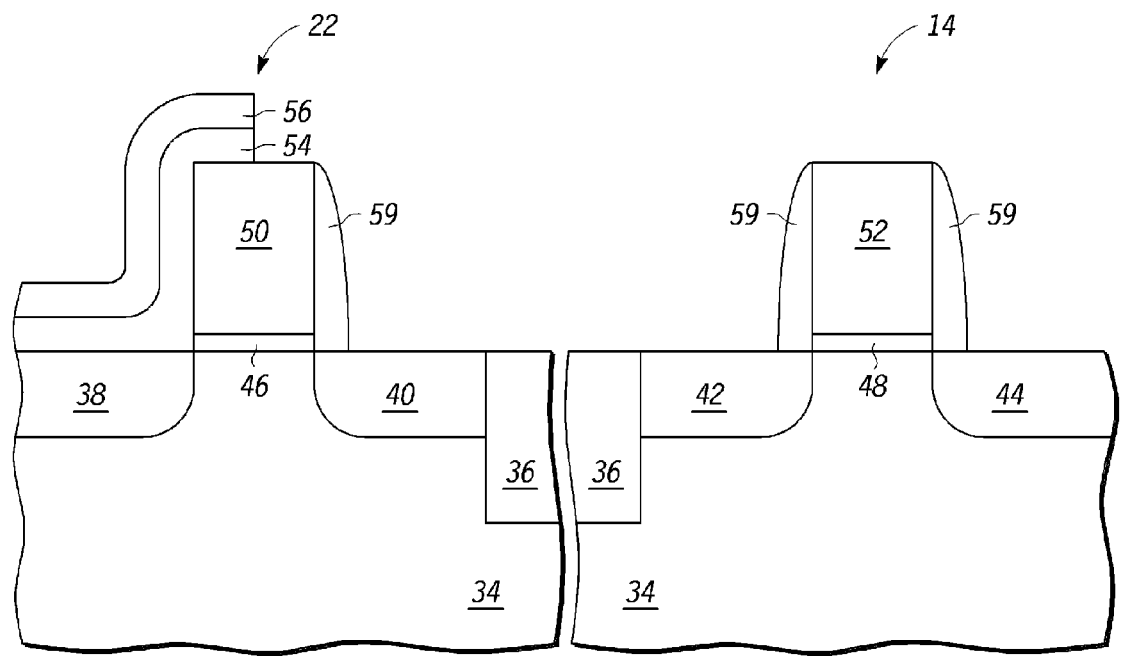
FIG. 3 illustrates the semiconductor device of FIG. 2 after patterning the spacer material layer in accordance with an embodiment of the invention.

As illustrated in FIG. 3, after forming the spacer material layer 54 over the semiconductor substrate 34, a mask 56 is formed over the spacer material layer 54 and used to pattern the spacer material layer 54. In other words, using the mask 56, portions of the spacer material layer 54 are removed to form spacers 59 and leave a portion of the spacer material layer 54 under the mask 56. The mask 56 may be a photoresist layer. Any unmasked portions of the spacer material layer 54 are removed (e.g., by a dry etch) except for the unmasked portions of the spacer material layer 54 that are adjacent sidewalls of the gate electrodes 50 and 52. These unmasked portions of the spacer material layer 54 form spacers 59. An anisotropic etch can be used for form the spacers 59. Hence, portions of the spacer material layer 54 under the mask 56 and portions that form the spacers 59 remain. As illustrated, the mask 56 and hence, the portions of the spacer material layer 54 under the mask 56 remain over the source extension 38 and a sidewall of the gate electrode 50, and may remain over a portion of the gate electrode 50. It is irrelevant how much of the gate electrode 50 is covered by the patterned spacer material layer 54 provided the spacer material layer 54 after patterning terminates anywhere between one sidewall of the gate electrode 50 and the opposite sidewall of the gate electrode 50. Thus, having the remaining spacer material layer (and the mask 56) stop approximately half way between the sidewalls of the gate electrode 50, as shown in FIG. 3, is just one embodiment. In the direction in and out of the page, the remaining spacer material layer 54 should not go to the n-poly/p-poly boundary, if the gate electrodes 50 and 52 are poly (polysilicon) gates.

Figure 4:
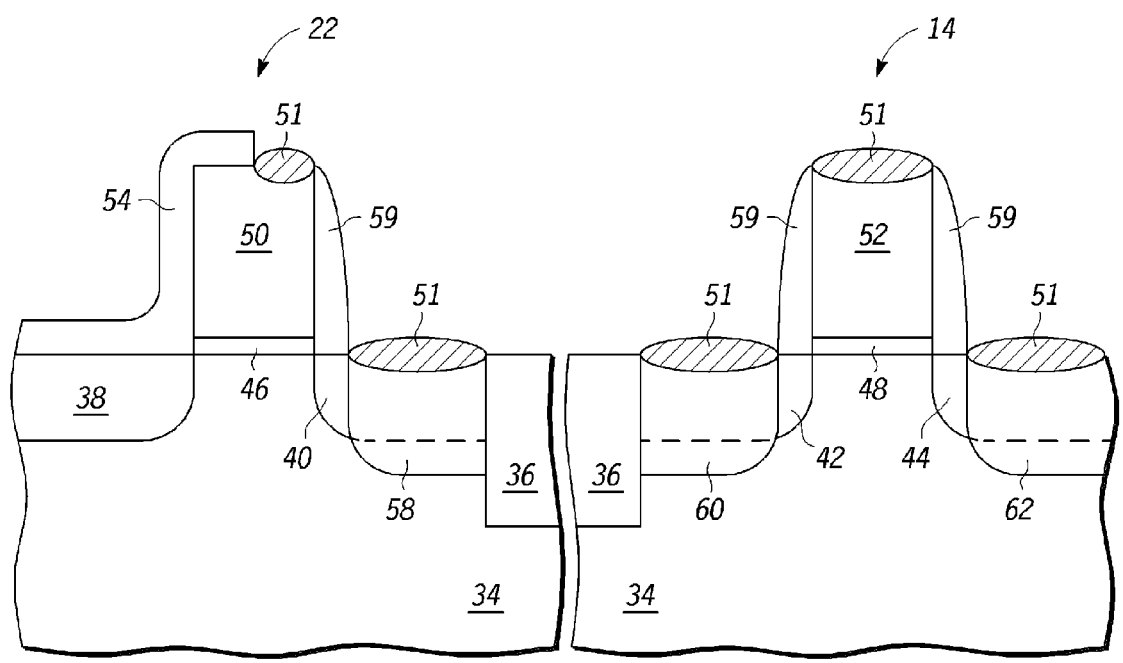
FIG. 4 illustrates the semiconductor substrate of FIG. 3 after forming silicide areas in accordance with an embodiment of the invention.

After patterning the spacer material layer 54, the mask 56 is removed using conventional processing (e.g., an ash process). Next, areas of substrate 34 that are exposed are doped to form a deep PMOS drain 58, a deep NMOS source 60, and a deep NMOS drain 62, as shown in FIG. 4. In one embodiment, the deep PMOS drain 58 is formed through an ion implantation process using a dopant, such as boron, at a dose of approximately $5 \times 10^{15}$ cm$^{-2}$. In one embodiment, the deep NMOS source 60 and deep NMOS drain 62 are formed through an ion implantation process using a dopant, such as arsenic, at a dose of approximately $5 \times 10^{15}$ cm$^{-2}$. Additional patterning steps not illustrated may be needed, as recognized by a skilled artisan. After forming the deep source and drains, silicided areas 51 are formed over portions of the complementary transistors 32 that are exposed and include silicon. Thus, silicide areas 51 are formed over any exposed portions of the gate electrode 50, the deep PMOS drain 58, the deep NMOS source 60, the gate electrode 52, and the deep NMOS drain 62 (if these regions include silicon) using any known silicidation process, also illustrated in FIG. 4. For example, the silicide areas 51 may be silicides of titanium, cobalt, nickel, platinum, erbium, ytterbium, the like, or alloys of the above.

Because the spacer material layer 54 covers the source PMOS extension 38 during implantation of dopants to form the deep PMOS drain 58 and during salicidation, a deep PMOS source and a silicide area over the source PMOS extension 38 are not formed. This increases the extension resistance and also the contact resistance in the source area. During the further processing, the spacer material layer 54 may be removed after forming the silicide areas 51. Alternatively, the spacer material layer 54 may remain and a contact can be formed in the spacer material layer 54 when forming a contact in the subsequently formed interlevel dielectric layer (ILD) layer. Conventional processing is then continued to form metal layers and other features of semiconductor devices. This process is easy to implement as it involves a mask change and does not add additional processing steps.

Figure 5:
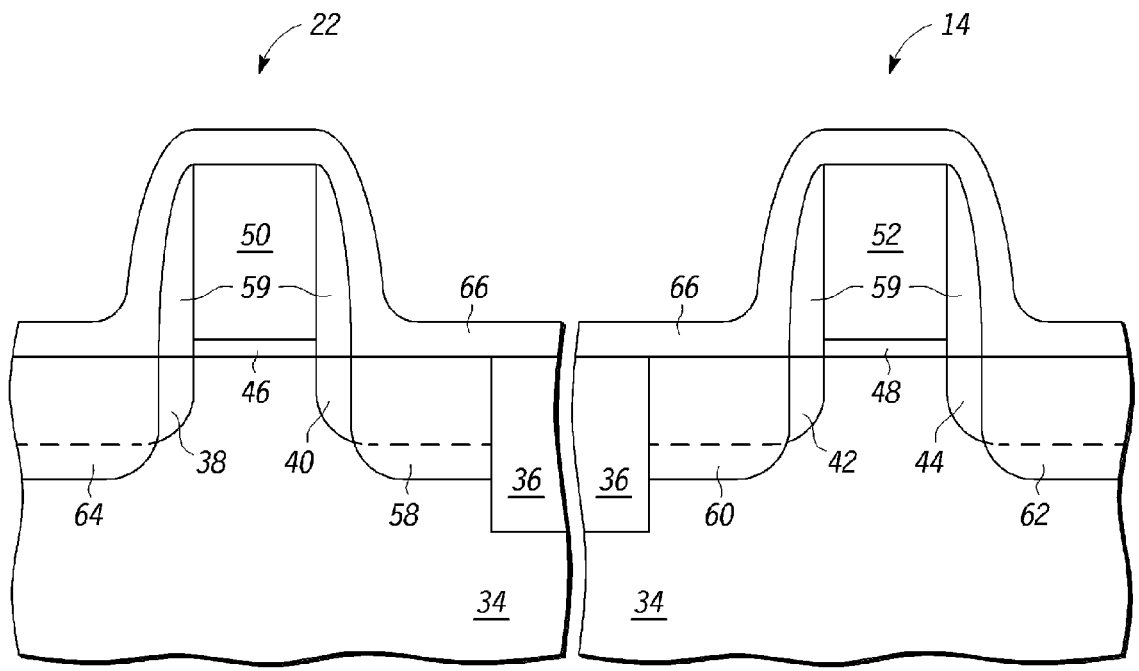
FIG. 5 illustrates a cross-section of a portion of a semiconductor device having an RPO (resistor protect oxide) layer in accordance with an embodiment of the invention.

In another embodiment, a resistor protect oxide layer 66 is formed over the substrate 34, as shown in FIG. 5. Prior to forming the resistor protect oxide layer 66, the deep PMOS source 64, the deep PMOS drain 58, the deep NMOS source 60, the deep NMOS drain 62 (as well as the extensions 38, 40, 42, and 44), and the spacers 59 are formed. In one embodiment, the resistor protect oxide layer 66 is silicon dioxide formed by any suitable process, such as PECVD (plasma enhance chemical vapor deposition) or LPCVD (liquid plasma chemical vapor deposition).

Figure 6:
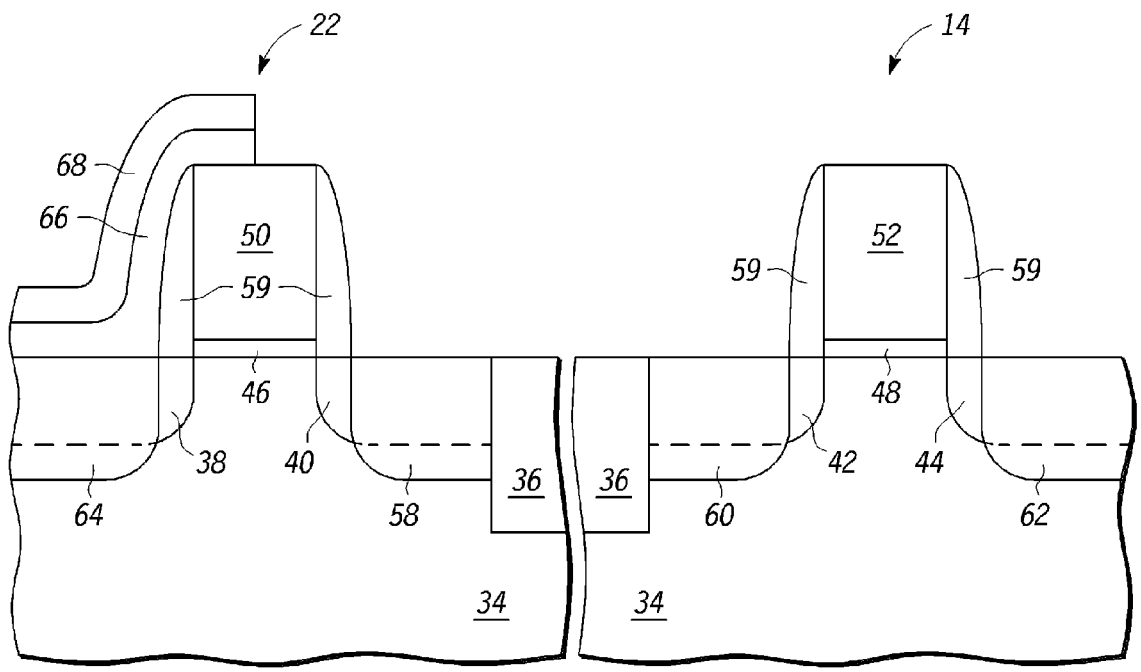
FIG. 6 illustrates the semiconductor substrate of FIG. 5 after patterning the RPO layer in accordance with an embodiment of the invention.

As shown in FIG. 6, a mask 68, such as photoresist, is formed over the resistor protect oxide (RPO) layer 66. The mask 68 is patterned to remain over the source extension 38, a sidewall of the gate electrode 50 and may remain over a portion of the gate electrode 50. The mask 68 is used to pattern (e.g., etch or remove) exposed portions of the RPO layer 66. It is irrelevant how much of the gate electrode 50 is covered by the RPO layer 66 provided the RPO layer 66 after patterning terminates anywhere between one sidewall of the gate electrode 50 and the opposite sidewall of the gate electrode 50. Thus, having the remaining RPO layer 66 (and the mask 68 when present) stop approximately half way between the sidewalls of the gate electrode 50, as shown in FIG. 6, is just one embodiment.

Figure 7:
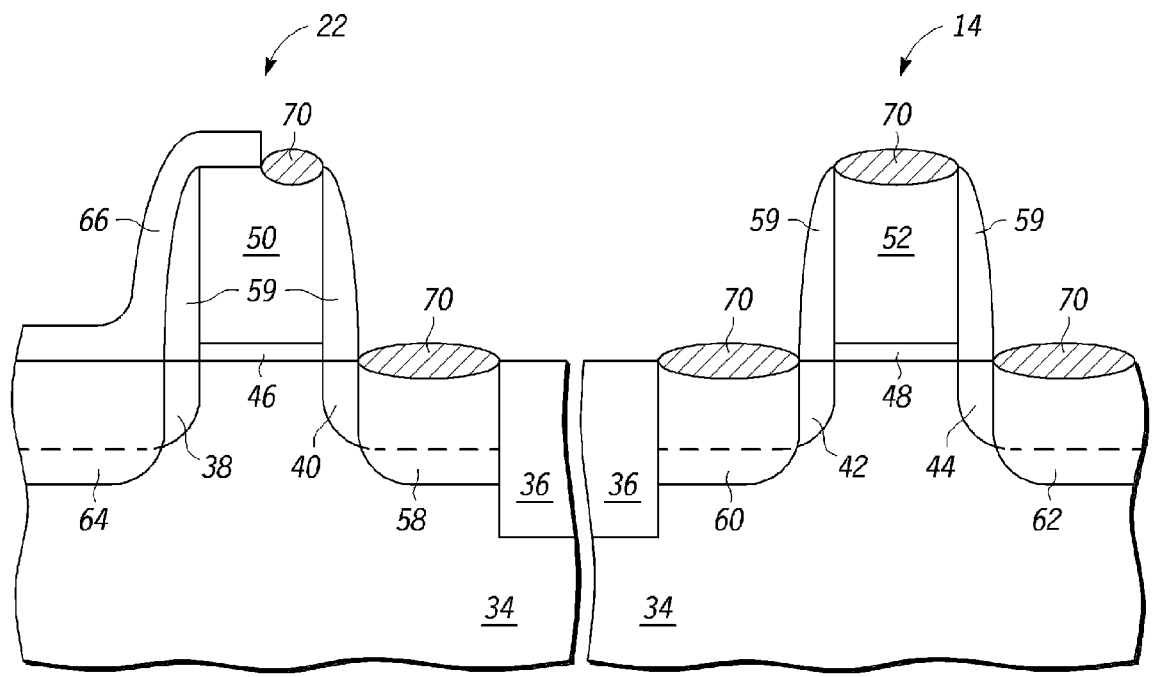
FIG. 7 illustrates the semiconductor substrate of FIG. 6 after forming silicide areas in accordance with an embodiment of the invention.

As illustrated in FIG. 7, after patterning the RPO layer 66, the making layer 68 is removed and silicide areas 70 are formed. Silicided areas 70 are formed over portions of the complementary transistors 32 that are exposed and include silicon, as previously described with respect to FIG. 4.

Because the RPO layer 66 covers the source PMOS extension 38 during silicidation, a silicide area is not formed over the source PMOS extensions 38. This increases the contact resistance in the source area. During the further processing, the RPO layer 66 may be removed after forming the silicide areas 51. Alternatively, the RPO layer 66 may remain and a contact can be formed in the RPO layer 66 when forming a contact in the subsequently formed interlevel dielectric layer (ILD) layer (not shown). Conventional processing is then continued to form metal layers and other features of semiconductor devices. This process is easy to implement as it involves a mask change and does not add additional processing steps.

Figure 8:
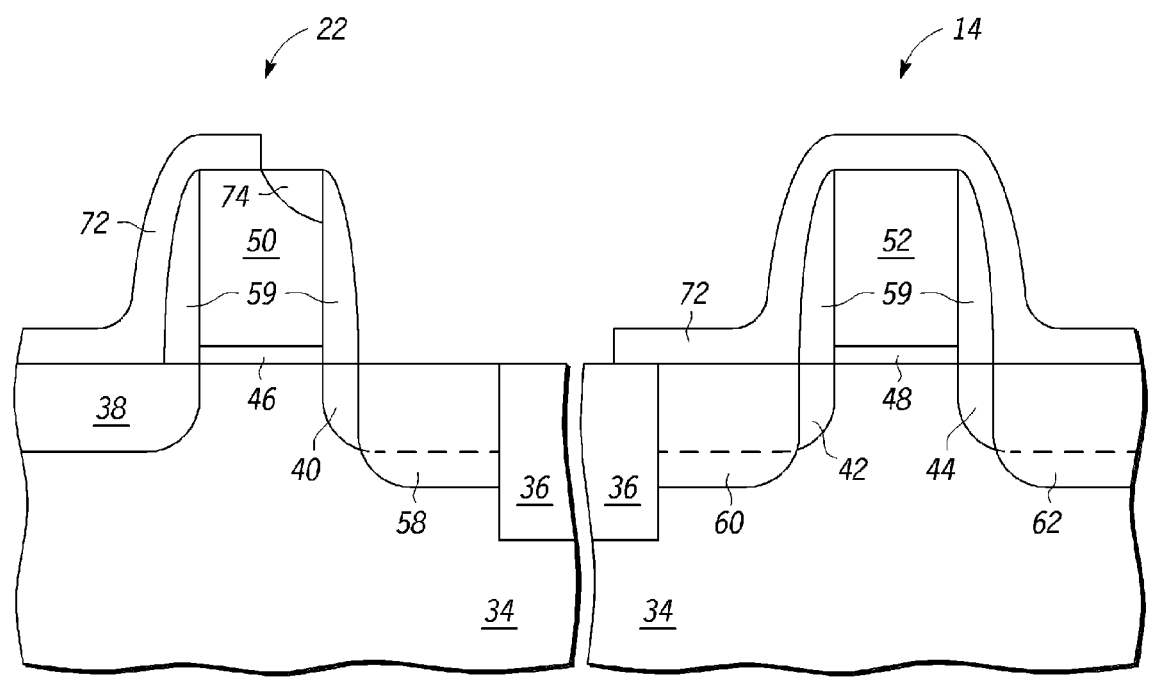
FIG. 8 illustrates a cross-section of a portion of a semiconductor device having a deep drain region in accordance with an embodiment of the invention.

In another embodiment, the source resistance is increased by forming the deep PMOS drain 58, but not the deep PMOS source so that the PMOS transistor 22 has asymmetrical deep source/drain regions, similar to the structure illustrated in FIG. 4. As shown in FIG. 8, processing has occurred to form spacers 59 around both the gate electrode 50 and the gate electrode 52. In addition, the deep NMOS source 60 and the deep NMOS drain 62 (and the extensions) are already formed in the semiconductor substrate 34. An implant mask 72, which may be photoresist, is formed over the semiconductor substrate 34 to expose at least the portion of the PMOS drain that is going to be implanted to form the deep PMOS drain. Thus, the NMOS transistors 14 and the source extensions 38 are covered by the implant mask 72. In addition, at least a portion of the gate electrode 50 may be covered by the implant mask 72. As discussed in other embodiments, it does not matter how much of the gate electrode 50 is covered by the mask, which here is the implant mask 72. Using the implant mask 72, P-type dopants are implanted into the exposed portions of the complementary transistors 32. In one embodiment, boron is implanted as at a dose of approximately $5 \times 10^{15}$ cm$^{-2}$. Thus, dopants are implanted into at least the drain region of the PMOS transistor 22 and into any exposed portions of the gate electrode 50. In one embodiment, dopants are implanted into gate doped region 74, which are areas of the gate electrode 50 that are exposed by the mask 72. The gate doped region 74 may not be formed if the entire gate electrode 50 is covered by the mask 72. After an anneal process, the deep PMOS drain 58 is formed and an implant region in the gate electrode 50 (if the gate electrode 50 is not fully covered by the implant mask 72, as illustrated in FIG. 8.)

Figure 9:
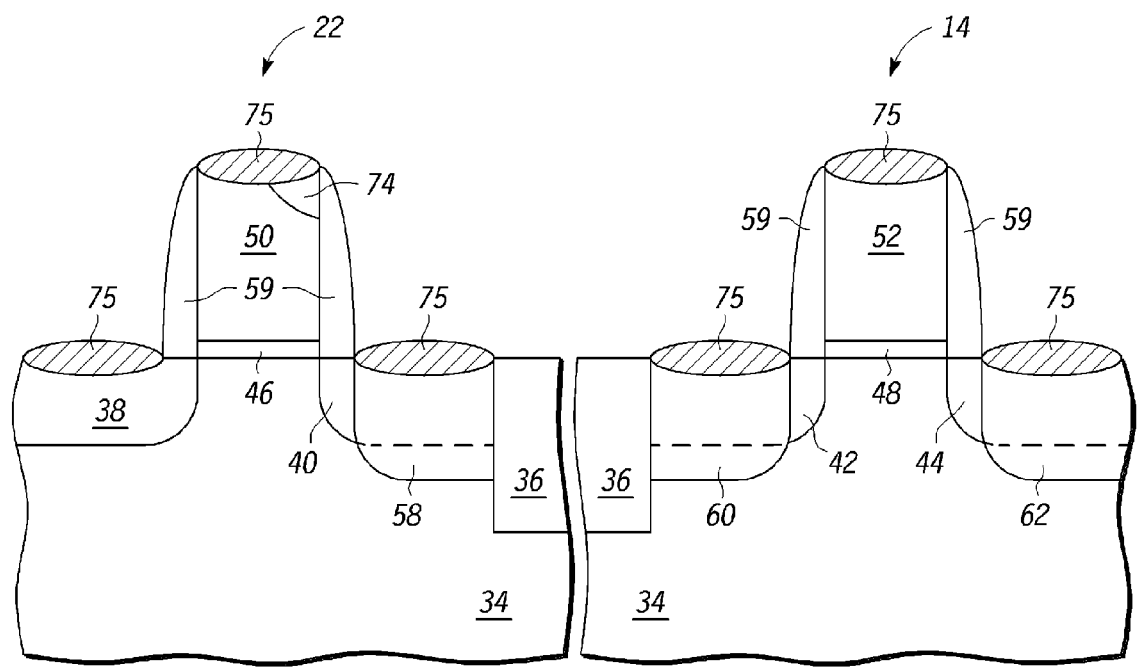
FIG. 9 illustrates the semiconductor device of FIG. 8 after forming silicide areas in accordance with an embodiment of the invention.

After forming the deep PMOS drain 58, the implant mask 72 is removed and a salicidation process is performed to form the silicide areas 75, as shown in FIG. 9. As discussed above, the silicide areas 75 will be formed over exposed areas of the complementary transistors 32 that include silicon. The presence of a deep PMOS drain without a deep PMOS source results in an increase in the source resistance. Conventional processing is then continued to form metal layers and other features of semiconductor devices. This process is easy to implement as it involves a mask change and does not add additional processing steps.

In one embodiment, instead of the asymmetry between the source and drain regions of the PMOS transistor 22 being due to differences in the deep source or drain, the asymmetry can be due to differences in the source and drain extension regions. For example, the source and drain extension regions can be asymmetric based on doping concentrations. For example, the source extension for the PMOS transistor may be doped more lightly than the drain extension so that the source extension is more resistive.

Figure 10:
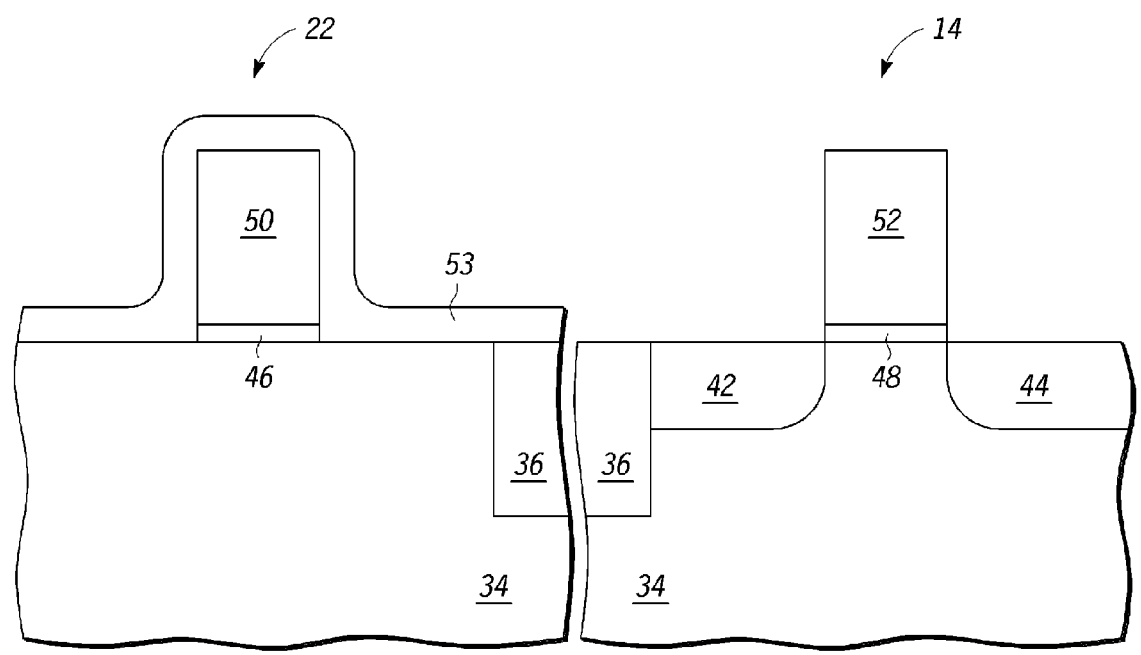
FIG. 10 illustrates a cross-section of a portion of a semiconductor device having a first mask in accordance with an embodiment of the present invention.

As shown in FIG. 10, the gate dielectrics 46 and 48 and the gate electrodes 50 and 52 are formed and patterned and a mask 53, which may be photoresist, is formed over the PMOS transistor 22. The mask 53 protects the PMOS region while the NMOS source extension 42 and the NMOS drain extensions 44 are being formed. The NMOS extensions 42 and 44 are formed by implanting an n-type dopant, such as arsenic. In one embodiment, a dose of approximately $5 \times 10^{14}$ cm$^{-2}$ is used. An anneal may occur immediately after the implantation or later on in the process, such as after the PMOS extensions are formed.

Figure 11:
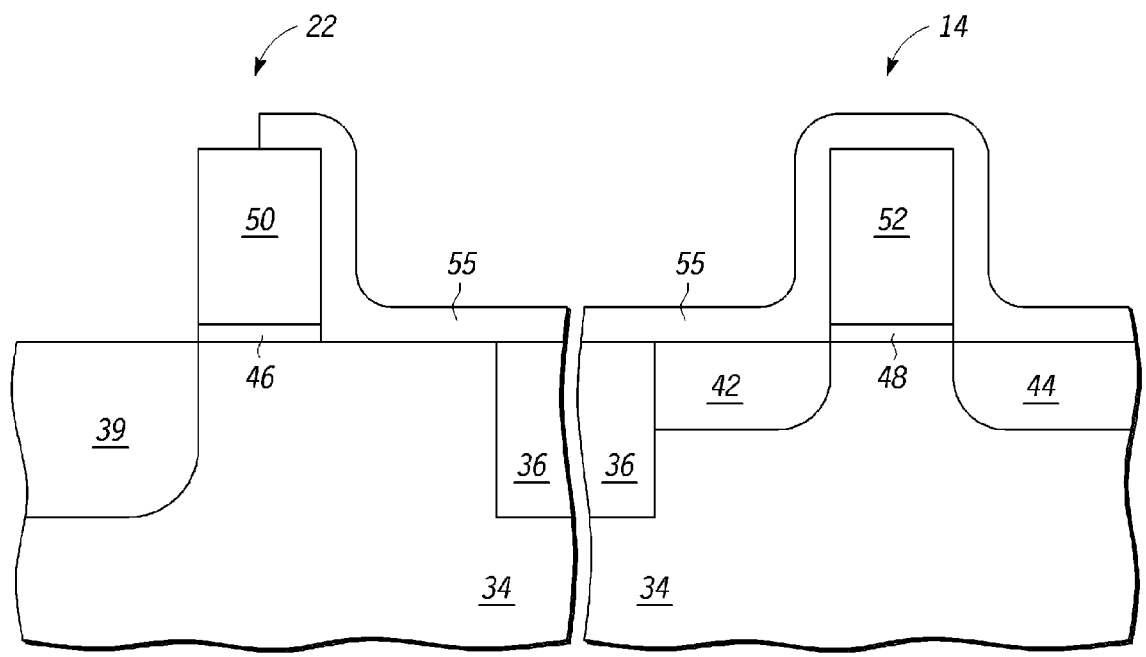
FIG. 11 illustrates the semiconductor device of FIG. 10 having a second mask in accordance with an embodiment of the invention.

After forming the NMOS extensions 42 and 44, the mask 53 is removed (e.g., by an ash process) and mask 55, which may be photoresist, is formed over all portions of the complementary transistors 32 except the source region of the PMOS transistor 22, (and possibly at least portions of the gate electrode 50) as shown in FIG. 11. The mask 55 protects all regions except the exposed portions of source region of the PMOS transistors 22 when implanting a p-type dopant to form the PMOS deep source extension 39. Again, an anneal may occur immediately after the implantation or later on in the process, such as after the PMOS drain extension is formed. In addition, the mask 55 may stop at any point over the gate electrode 50. As discussed in other embodiments, it does not matter how much of the gate electrode 50 is covered by the mask 55.

Figure 12:
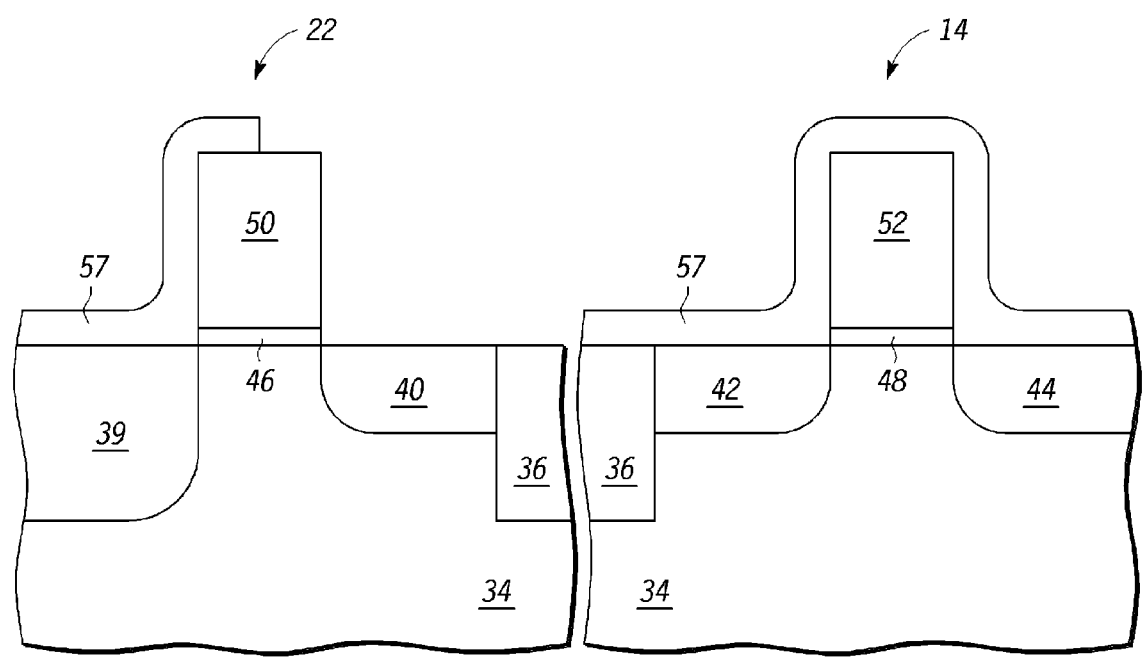
FIG. 12 illustrates the semiconductor device of FIG. 11 having a third mask in accordance with an embodiment of the invention.

As shown in FIG. 12, after forming the PMOS deep source extension 39, the mask 55 is removed and a mask 57, which may be photoresist, is formed over the NMOS transistor 14 and the source region of the PMOS transistor 22. The mask 57 protects the NMOS transistor 14 and the PMOS transistor 22 from the implantation of a p-type dopant for the PMOS drain extension 40. As discussed in other embodiments, it does not matter how much of the gate electrode 50 is covered. Again, an anneal may occur immediately after the implantation or later on in the process. In the embodiment illustrated, the deep PMOS source extension 39 is deeper and more lightly doped or shallower with a similar or lighter dose than the PMOS drain extension 40 and the NMOS extensions 42 and 44 so that the source region has a greater resistance than the drain region in the SRAM device. This increases the extension resistance in the source region. Conventional processing may continue after removing the mask 57 to from the completed complementary transistors 32. In one embodiment, the processes described for FIGS. 8 and 9 may be followed after removing the mask 57.

Figure 13:
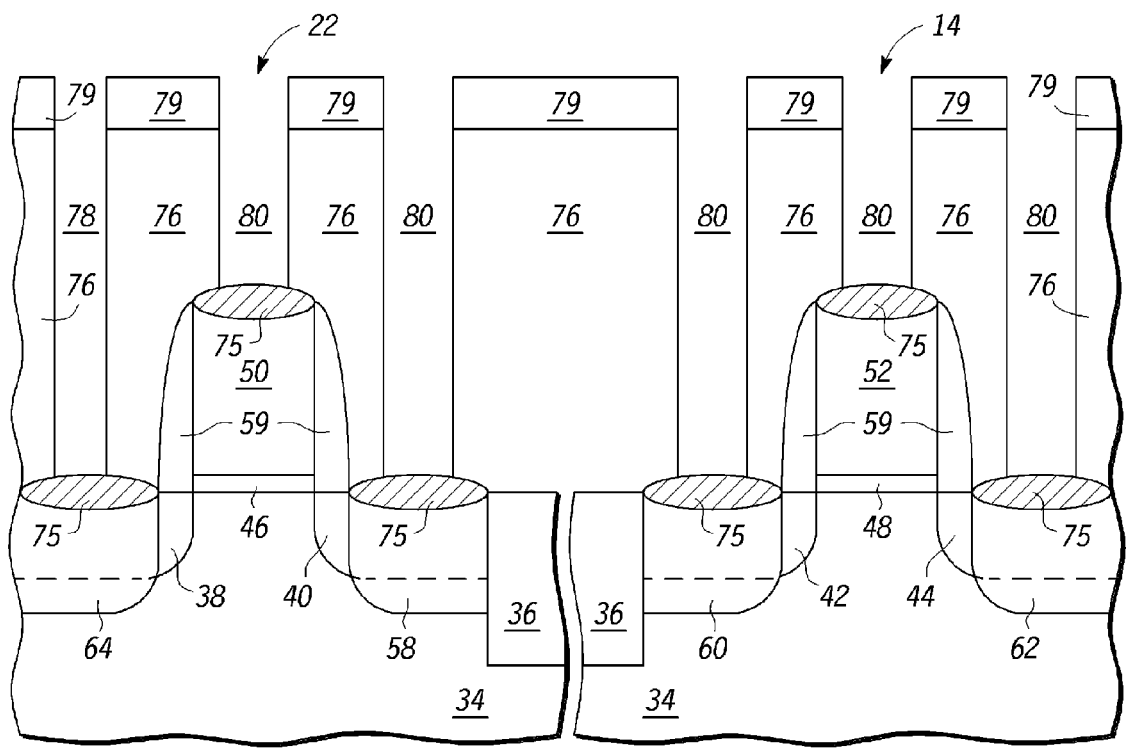
FIG. 13 illustrates a cross-section of a portion of a semiconductor device having contact openings in accordance with an embodiment of the invention.

In one embodiment, the resistance in the source area is altered by changing the properties of the PMOS source contact. As shown in FIG. 13, conventional processing is performed to form the PMOS transistor 22 and the NMOS transistor 14. (Alternatively, any process described here can be used instead of conventional processing to further increase the resistance in the PMOS source region.) After forming the salicided area 75, an ILD layer 76 is formed over the complementary transistors 32. The ILD layer 76 can be any suitable material, such as silicon dioxide formed using TEOS (tetraethyl orthosilicate), F-TEOS (fluorinated tetraethyl orthosilicate), silicon nitride, silicon oxynitride, a material having a low dielectric constant, or combinations of the above. A low dielectric constant material is a material having a dielectric constant less than that of silicon dioxide. A mask 79, such as photoresist, is formed over the ILD layer. The mask 79 can be a hardmask, such as silicon nitride, that is patterned by etching using a photoresist layer as a mask (not shown). The mask 79 is used to etch the ILD layer 76 to form wide contact openings 80, which are over the PMOS gate electrode 50, the PMOS drain region, the NMOS source region, the NMOS gate electrode 52, and the NMOS drain region, and narrow contact openings 78, which are over the PMOS source region. In one embodiment, the wide contact openings 80 have a dimension (e.g., diameter or opening length) at the surface of the ILD layer 76 that is greater than that of the narrow contact opening 78.

Figure 14:
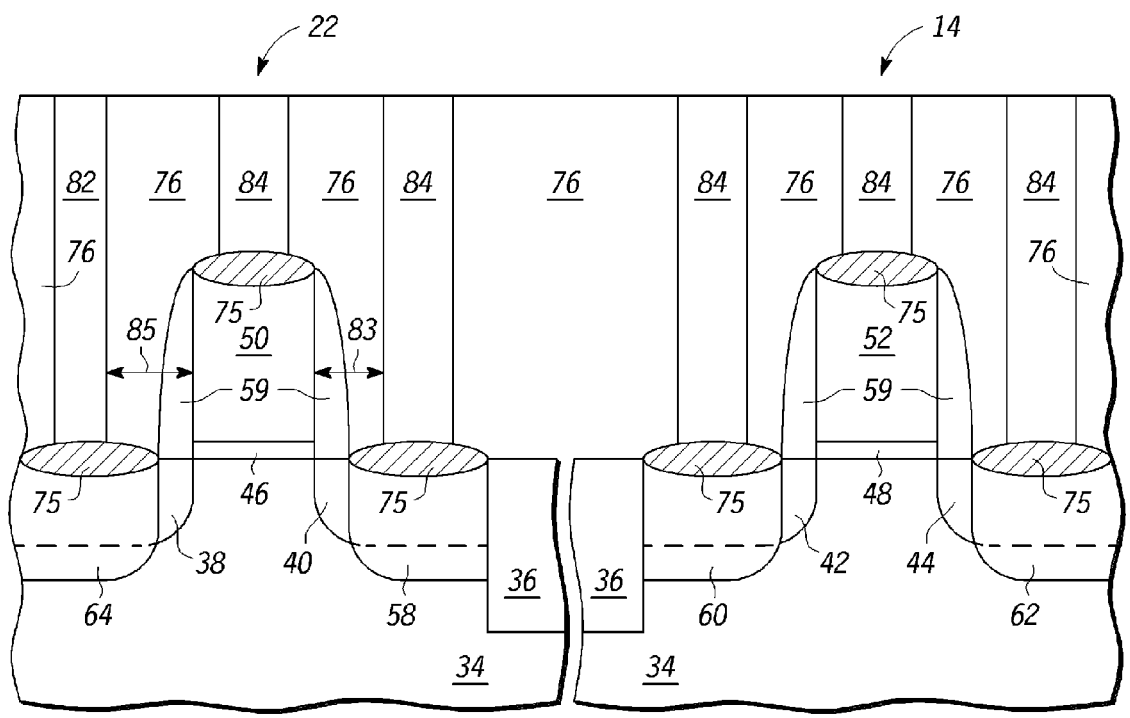
FIG. 14 illustrates the semiconductor device of FIG. 13 after forming contacts in accordance with an embodiment of the invention.

As illustrated in FIG. 14, after forming the wide contact openings 80 and the narrow contact opening 78, the openings 80 and 78 are filled with a conductive material (e.g., aluminum, tungsten, titanium, titanium nitride, tantalum, tantalum nitride, copper, the like, or combinations of the above) to form wide contacts 84, which are coupled to the PMOS gate electrode 50, the PMOS drain region, the NMOS source region, the NMOS gate electrode 52, and narrow contact 82, which is coupled to the PMOS source region. In one embodiment, the wide contacts 84 have a surface contact area that is greater than that of the narrow contact 82. In addition, the wide contacts 84 may have a greater volume than that of the narrow contact 82. In addition or alternatively, the narrow contact 82 may be farther away from the closest sidewall of the gate electrode 50 than the wide contact 84 is to its closest sidewall of the gate electrode 50 over the PMOS drain region. In other words in these embodiments, the drain/gate distance 83 is less than the source/gate distance 85. In this embodiment, the memory cell may be undesirably increased in area; however, the resistance in the source region is desirably increased. Thus, in one embodiment, the narrow contact 82 has a lesser volume, surface area, or both than the wide contacts 80 but the drain/gate distance 83 is substantially equal to the source/gate distance 85. In another embodiment, not only does the narrow contact 82 has a lesser volume, surface area, or both than the wide contacts 80 but the drain/gate distance 83 is lesser than the source/gate distance 85. In yet another embodiment, the drain/gate distance 83 is greater than the source/gate distance 85, but the narrow contact 82 has a volume, surface area, or both substantially equal to each of the wide contacts 80.

Figure 15:
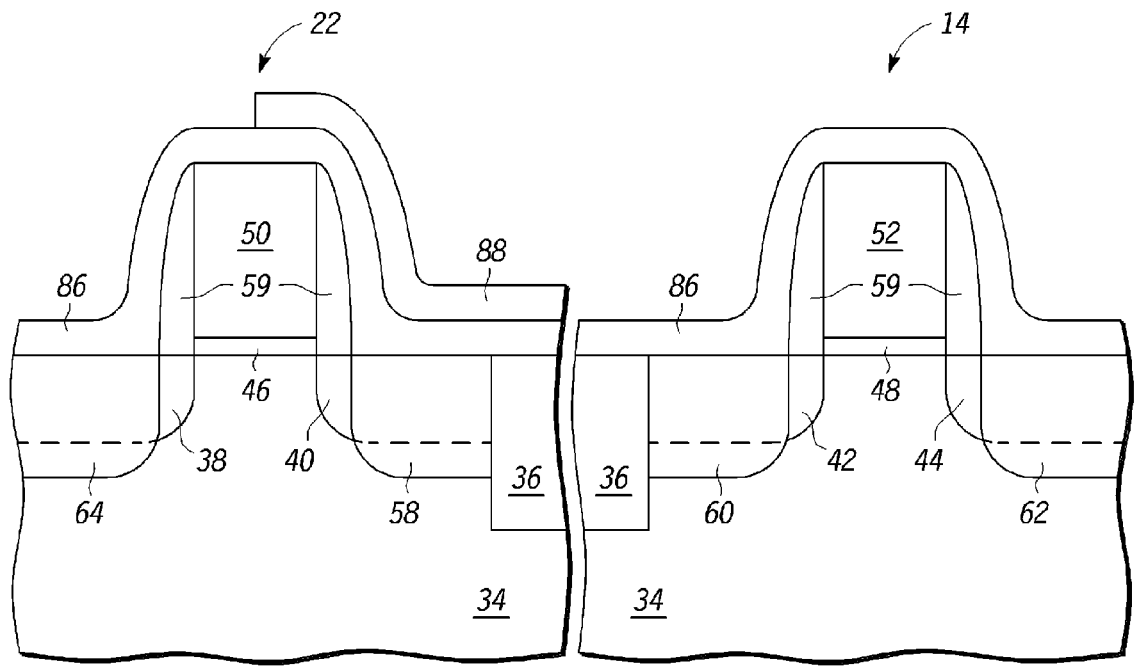
FIG. 15 illustrates a cross-section of a portion of a semiconductor device having a protection layer in accordance with an embodiment of the invention.

In another embodiment, a high barrier height silicide is formed over the PMOS source region to increase the contact resistance in the source region. As shown in FIG. 15, a PMOS protective layer 86 is formed over the substrate 34. In one embodiment, the PMOS protective layer 86 includes silicon oxide, silicon nitride, silicon oxynitride, or combinations of the above. In one embodiment, the PMOS protective layer 86 is a PMOS drain protective layer. A mask 88, which may be photoresist, is formed over the PMOS protective layer 86. The mask 88 is patterned to so that it overlies at least the drain region of the PMOS transistor 22. Conventional processing is performed to form the PMOS transistor 22 and the NMOS transistor 14. (Alternatively, any process described here can be used instead of conventional processing to further increase the resistance in the PMOS source region.)

Figure 16:
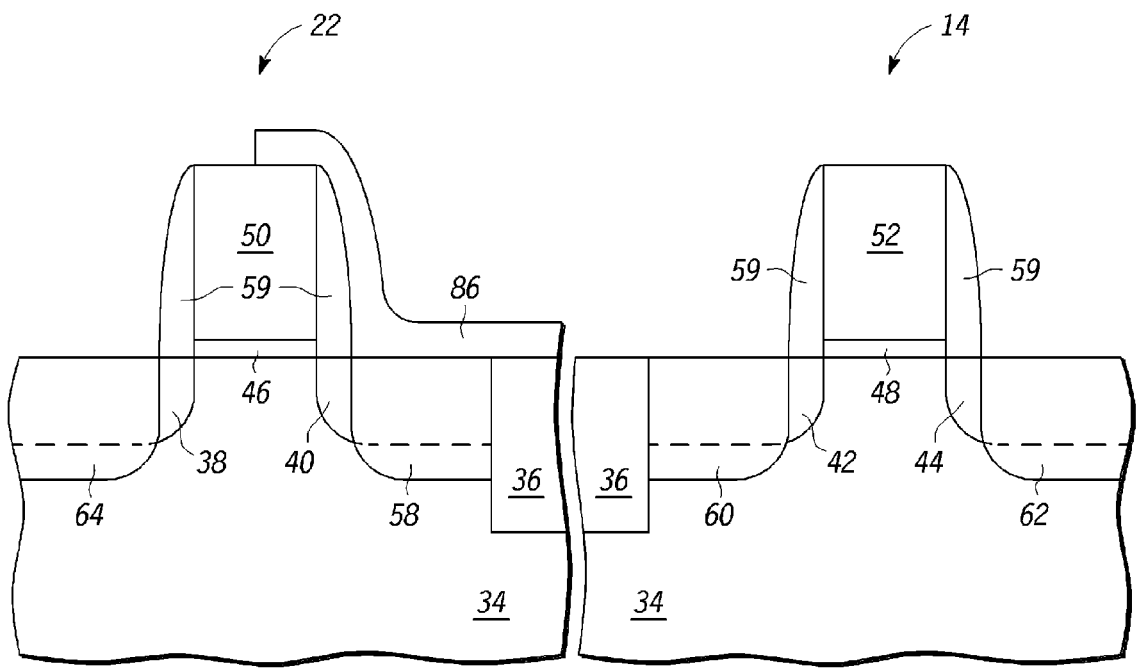
FIG. 16 illustrates the semiconductor device of FIG. 15 after patterning the protection layer in accordance with an embodiment of the present invention.

As illustrated in FIG. 16, during a patterning process (e.g., an etch process), the mask 88 is used to pattern the PMOS protective layer 86 so that all portions of the PMOS protective layer 86 are removed except for portions that are over the drain region of the PMOS transistor 22, the spacer 59 and possibly at least a portion of the gate electrode 50. As in other embodiments and discussed in more detail above, how much of the gate electrode 50 that is covered by the PMOS protective layer 86 can vary. After patterning the PMOS protective layer 86, the mask 88 is removed (e.g., by an ash process.)

Figure 17:
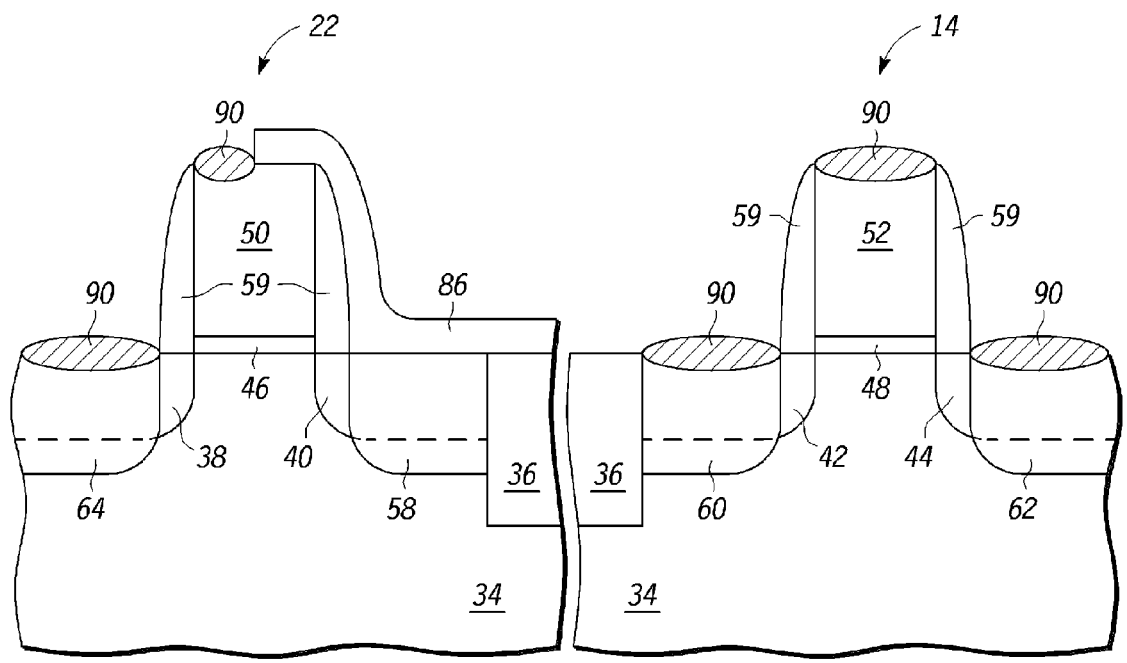
FIG. 17 illustrates the semiconductor device of FIG. 16 after forming first silicide areas in accordance with an embodiment of the invention.

As shown in FIG. 17, after patterning the PMOS protective layer 86, silicide regions (or areas) 90 are formed over exposed region of the complementary transistors 32 that include silicon. The same silicide material may be used to silicide the NMOS source/drain regions, the NMOS gate electrode, any exposed portion of the PMOS gate electrode, and the PMOS source region, as in the embodiment illustrated. The silicide regions 90 may include a material with lower barrier height than NMOS source/drain regions 60 and 62, and with a higher barrier height than the PMOS source region 64. Such materials may include silicides of gadolinium, dysprosium, holmium, yttrium, erbium, ytterbium, nickel, the like, or combinations of the above.

Figure 18:
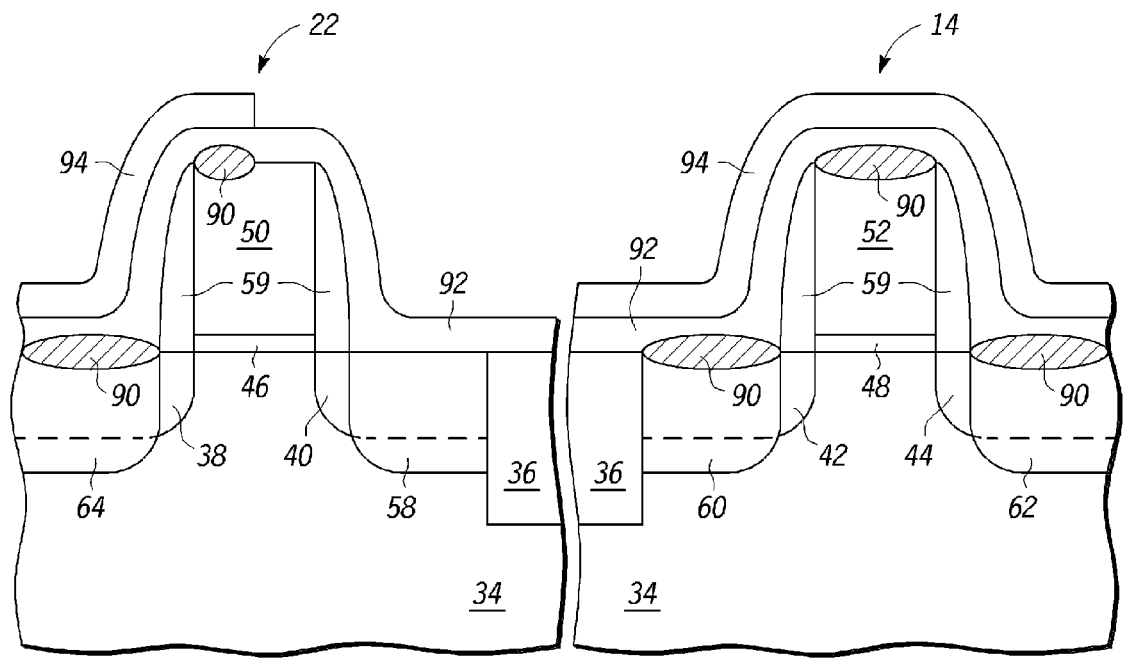
FIG. 18 illustrates the semiconductor device of FIG. 17 after forming another protection layer in accordance with an embodiment of the invention.

After forming the silicide regions 90 and removal of the PMOS protective layer 86, in one embodiment, a NMOS protective layer 92 is formed over the substrate 34 and a mask 94, which may be a photoresist, is formed over the NMOS protective layer 92. The NMOS protective layer 92 may be silicon oxide, silicon nitride, silicon oxynitride, or combinations of the above. The mask 94 is patterned so that a portion of the NMOS protective layer that is over the drain region is exposed, as shown in FIG. 18. In addition, portions of the NMOS protective layer 92 over the spacer 59 and at least a portion of the gate electrode may be exposed. As in other embodiments and previously discussed, how much of the NMOS protective layer 92 that is over the gate electrode 50 can vary. The NMOS protective layer 92 can extend past the silicided region 90, as illustrated, or stop on the silicide area 90 (not illustrated).

Figure 19:
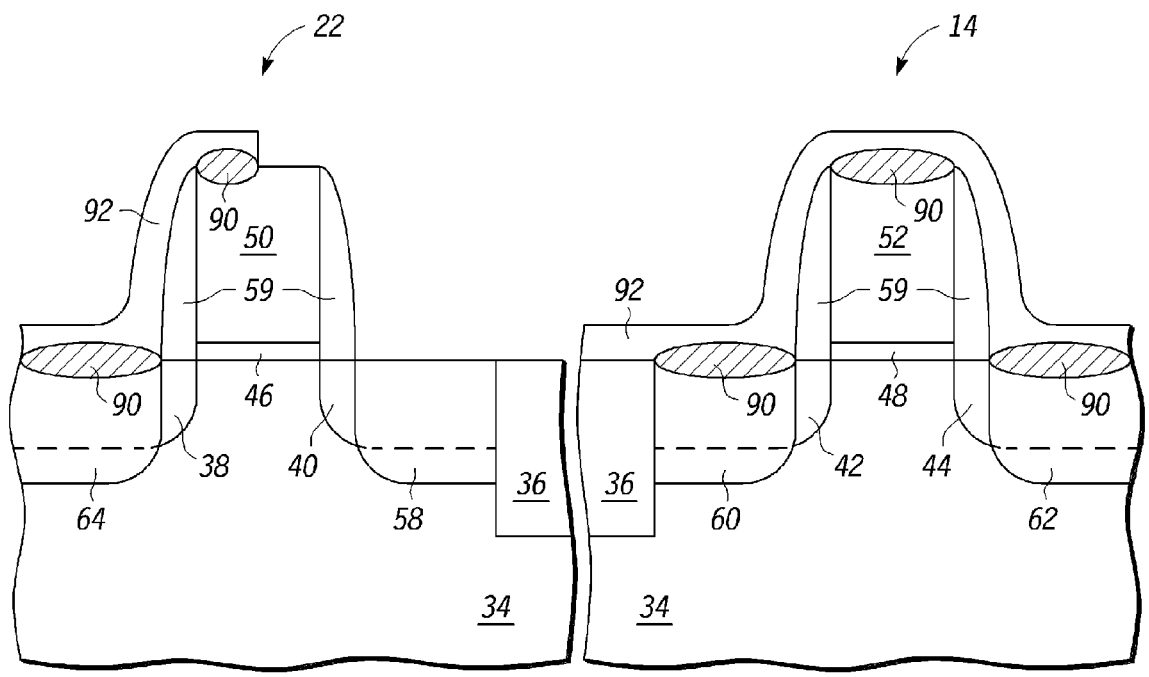
FIG. 19 illustrates the semiconductor device of FIG. 18 after patterning the protection layer in accordance with an embodiment of the invention.

As illustrated in FIG. 19, during a patterning process (e.g., an etch process), the mask 94 is used to pattern the NMOS protective layer 92 so that portion of the NMOS protective layer 92 are removed, for example, for portions that are over the drain region of the PMOS transistor 22, the spacer 59 and possibly at least a portion of the gate electrode 50. After patterning the NMOS protective layer 92, the mask 94 is removed (e.g., by an ash process.)

Figure 20:
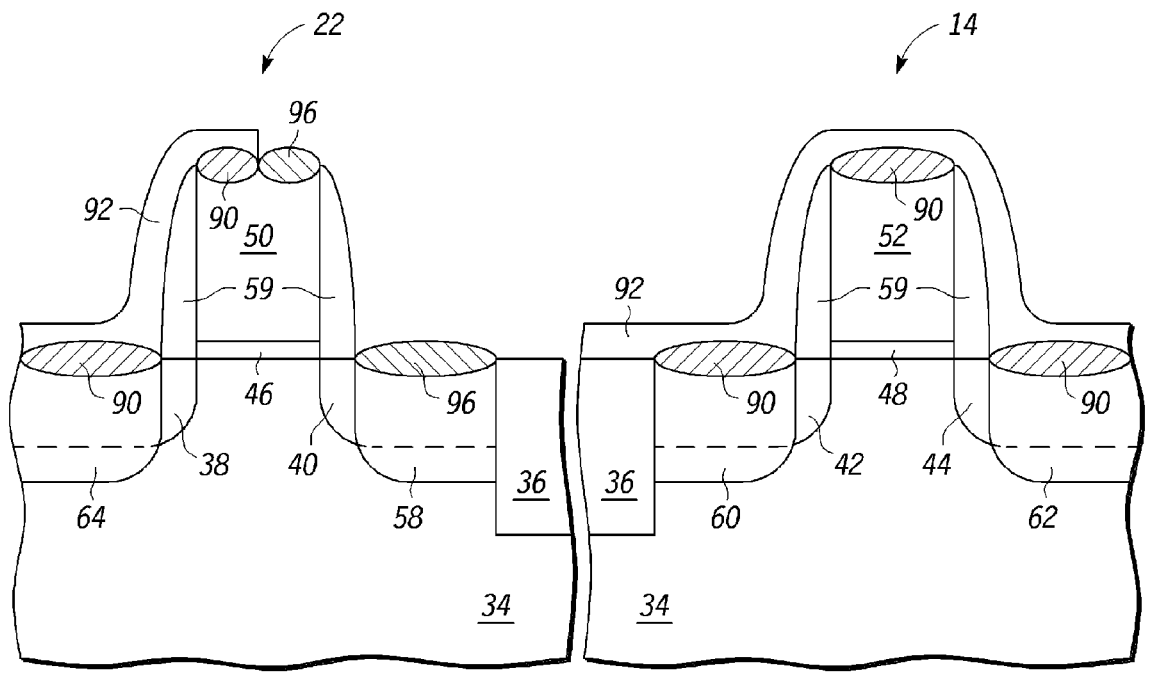
FIG. 20 illustrates the semiconductor device of FIG. 19 after forming the second silicide areas in accordance with an embodiment of the invention.

As shown in FIG. 20, after patterning the NMOS protective layer 92, silicided areas 96 are formed over exposed regions of the complementary transistors 32 that include silicon. The silicide material of the silicide area 96 is different than the silicide area 90 used for the NMOS source/drain regions, the NMOS gate electrode, any exposed portion of the PMOS gate electrode, and the PMOS source region. In one embodiment, the silicide areas 90 may be silicides of gadolinium, dysprosium, holmium, yttrium, erbium, ytterbium, nickel, the like, or combinations of the above, and the silicide areas 96 may be silicides of titanium, tantalum, cobalt, nickel, osmium, platinum, iridium, other silicides with a high barrier height to n-type silicon, the like, or combinations of the above. The materials for the silicide areas 90 have a higher barrier height to p-type silicon than the material chosen for the silicide areas 96. The silicide areas 90 and 96 formed over the gate electrode 50 may have a gap between them, may be in next to each other or in contact with each other (as shown), or may overlap.

Figure 21:
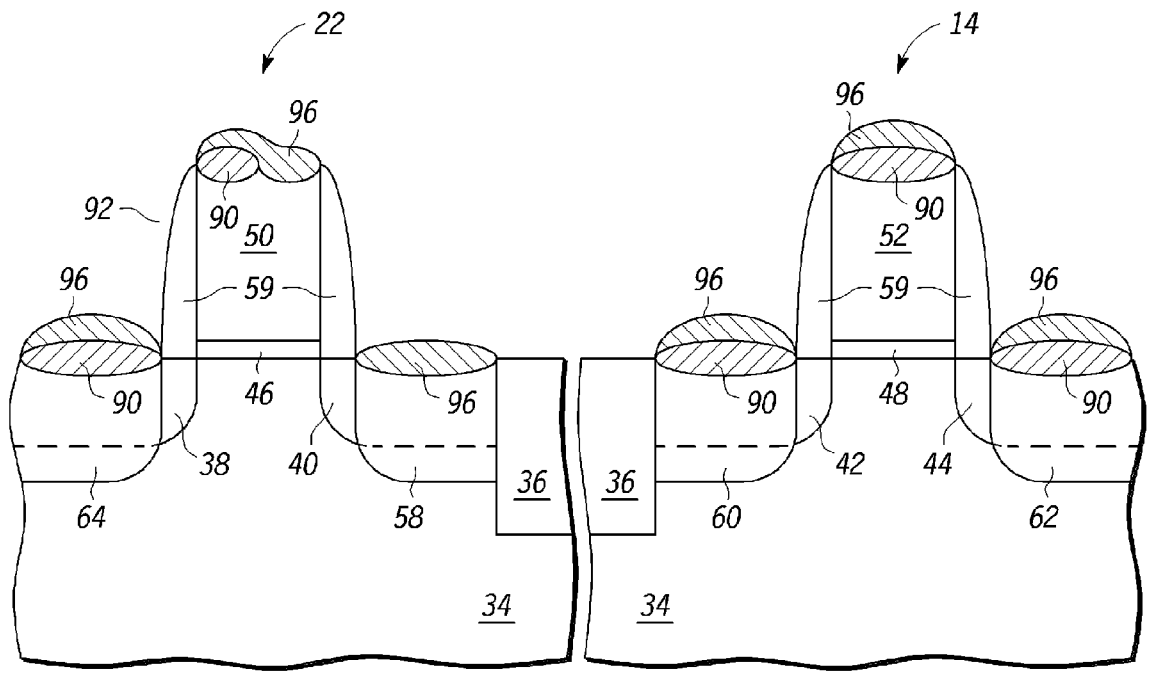
FIG. 21 illustrates the semiconductor device of FIG. 17 after forming the second silicide areas in accordance with a different embodiment of the present invention.

In another embodiment, after forming the forming the silicide areas 90, silicide areas 96 are formed over all regions that include silicon, as shown in FIG. 21. An NMOS protective layer and accompanying mask is not used. The result is that the silicide areas 96 are formed over the silicide regions 90, as well as the same regions as when an NMOS protective layer and accompanying mask are used. Regardless of which embodiment is employed, the PMOS source region has a different silicide material (e.g., silicide area 90 or silicide area 90 and silicide area 96) than the PMOS drain region, which only has silicide area 96 over it. By having a different salicide material over the PMOS source region than the PMOS drain region and having at least one silicide material over the source region that has a higher barrier height (and hence more resistant) than the drain region, the contact resistance in the source region is increased.

In another embodiment, the source resistance is increased by the PMOS deep source including a material that has a higher permittivity, conduction effective mass, and barrier heights than the silicon in the PMOS deep drain. This can be accomplished by removing the PMOS deep source area and replacing it with the desired material, which is shown in FIGS. 22-26.

Figure 22:
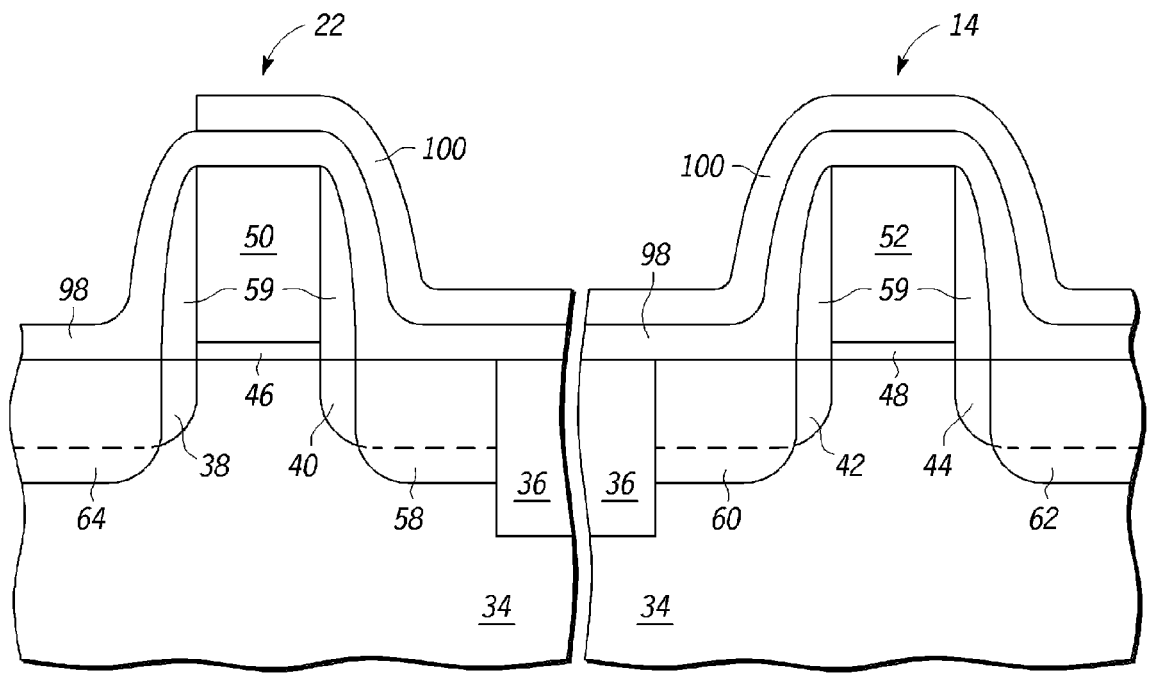
FIG. 22 illustrates a cross-section of a portion of a semiconductor device having a mask in accordance with an embodiment of the present invention.
Figure 23:
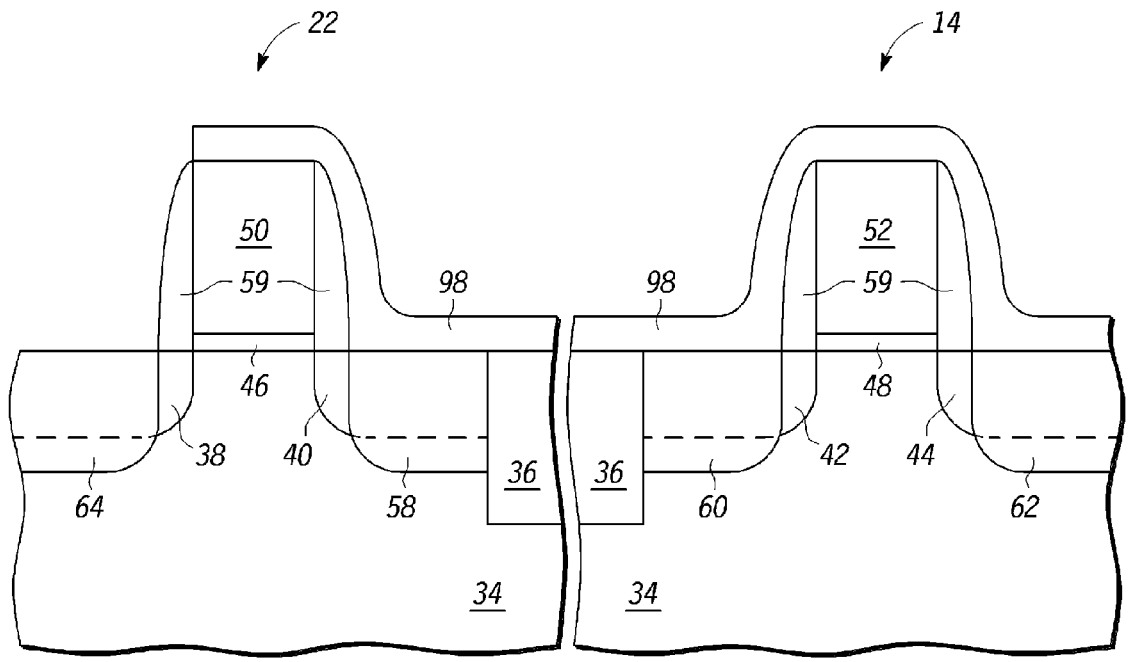
FIG. 23 illustrates the semiconductor device of FIG. 22 after patterning the mask in accordance with an embodiment of the invention.

FIG. 22 illustrates a mask 98, which may be silicon nitride, over the substrate 34 and mask 100, which may be photoresist, over the mask 98. Conventional processing is performed to form the PMOS transistor 22 and the NMOS transistor 14. (Alternatively, any process described here can be used instead of conventional processing to further increase the resistance in the PMOS source region.) The mask 100 exposes at least the PMOS deep source region and preferably covers the entire gate electrode 50. As shown in FIG. 23, the mask 100 is used to pattern the mask 98 (e.g., during an etch process) so as to expose the PMOS deep source region.

Figure 24:
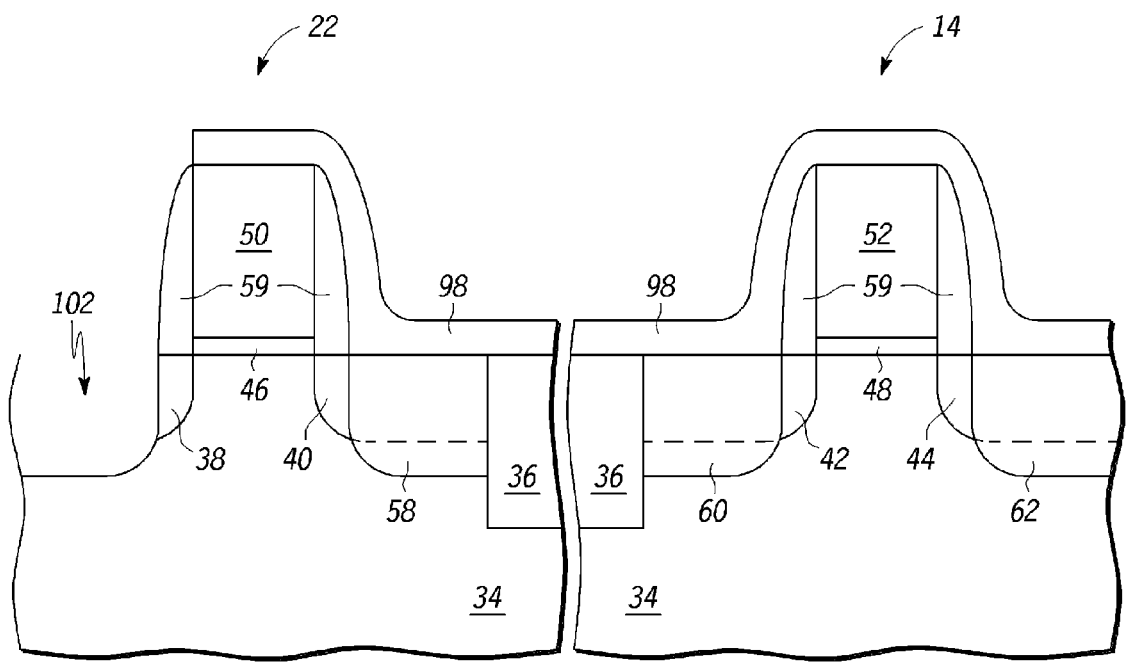
FIG. 24 illustrates the semiconductor device of FIG. 23 after removing a source region in accordance with an embodiment of the invention.

As shown in FIG. 24, the mask 98 protects other areas that may be etched (e.g., regions that include silicon) when removing the PMOS source region to form the removed source region 102. In one embodiment, the removed source region 102 is formed using an etch including $SF_6$, silicon hexafluoride.

Figure 25:
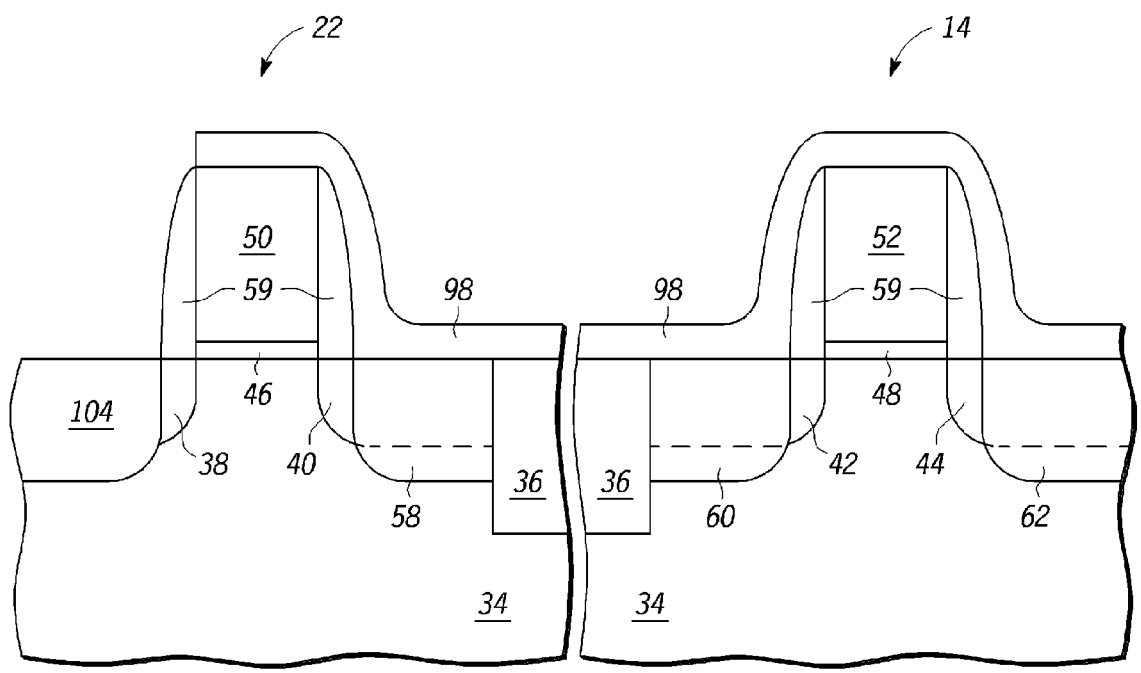
FIG. 25 illustrates the semiconductor device of FIG. 24 after forming another source region in accordance with an embodiment of the present invention.

As shown in FIG. 25, after forming the removed source region 102, a selectively filled source region 104 is selectively formed for example by selective epitaxy or selective MBE (molecular beam epitaxy). In one embodiment, the selectively filled source region 104 includes AlP, GaP, ZnS, Ge, $Si_{0.8}Ge_{0.2}$, AlN, AlAs, GaN, GaAs, Ge, InN, InP, ZnSe, the like, other semiconductor materials preferably have a diamond or zinc blende lattice structure, or combinations of the above. The selectively filled source region 104 is a different material than that of the substrate 34.

Figure 26:
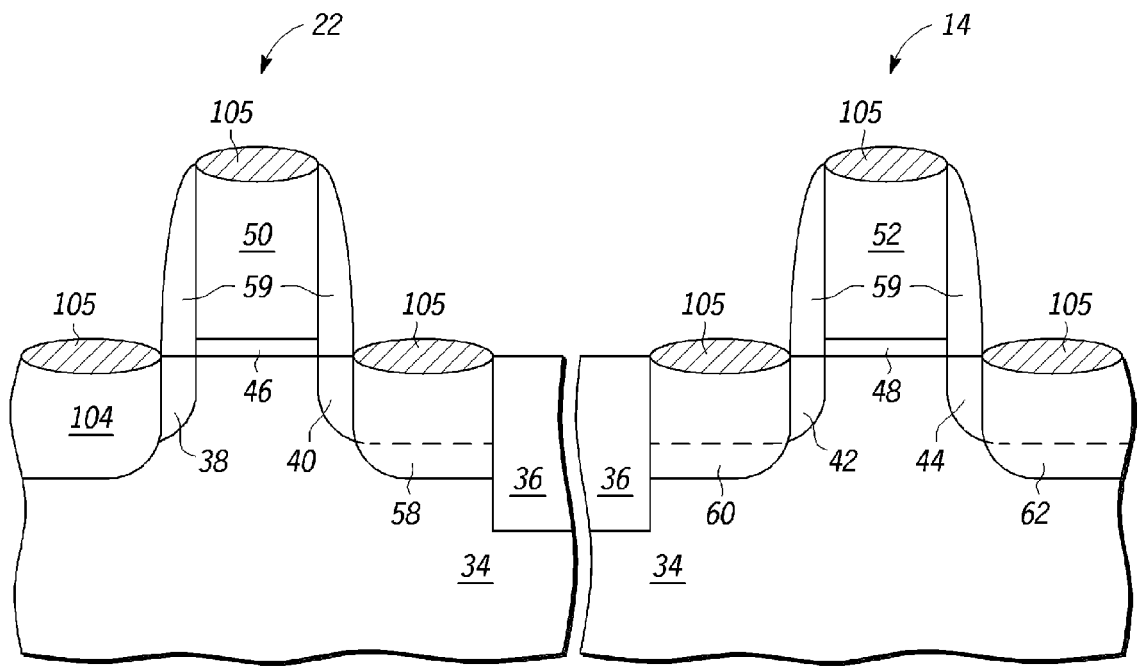
FIG. 26 illustrates the semiconductor device of FIG. 25 after forming silicide areas in accordance with an embodiment of the invention.

After forming the selectively filled source region 104, silicide regions 105 are formed over the source and drain regions and gate electrodes of the transistors if they include silicon, as illustrated in FIG. 26.

By now it should be appreciated that there has been provided ways to have a transistor having a source resistance being more than the drain resistance by the source region having a physical property that differs from the drain region. In other words, the $I_{dlin}$ (linear drain current) and $I_{dsat}$ (saturated drain current) of a transistor in a semiconductor device is decreased by increasing the source resistance.

As previously discussed, various embodiments can be combined with each other to further increase the source resistance or only one embodiment can be employed. While the embodiments, may be used with the 6-transistor SRAM, especially the pull-up or load transistors, described with respect to FIG. 1, the embodiments can be employed with other circuits, such as NVM circuits. Preferably, the channel and extensions of the PMOS transistor are unaltered so that device parameters other than performance are minimally affected.

Because the apparatus implementing the invention is, for the most part, composed of electronic components and circuits known to those skilled in the art, circuit details will not be explained in any greater extent than that considered necessary as illustrated above, for the understanding and appreciation of the underlying concepts of the invention and in order not to obfuscate or distract from the teachings of the invention.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention.

Although the invention has been described with respect to specific conductivity types or polarity of potentials, skilled artisans appreciated that conductivity types and polarities of potentials may be reversed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more. The term "coupled", as used herein, is defined as connected, although not necessarily directly, and not necessarily mechanically.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method of forming a transistor comprising:
   providing a substrate;
   forming a source electrode in the substrate;
   forming a drain electrode in the substrate and lateral to the source electrode;
   forming a control electrode overlying the substrate and laterally between the source electrode and the drain electrode to form a channel between the source electrode and the drain electrode;
   modifying a physical property of at least one of the source electrode and the drain electrode to raise resistance of the source electrode to be greater than that of the drain electrode; and
   saliciding the source electrode with a first salicide material; and
   saliciding the drain electrode with a second salicide material that differs from the first salicide material.

2. The method of claim 1 further comprising:
   modifying the physical property of at least one of the source electrode and the drain electrode by saliciding the drain electrode while blocking salicidation of the source electrode.

3. The method of claim 2 further comprising:
   implementing the source electrode and the drain electrode as implant regions having substantially the same dose and energy.

4. The method of claim 1 further comprising:
   modifying the physical property of at least one of the source electrode and the drain electrode by doping the drain electrode with a predetermined implant while blocking said implant of the source electrode.

5. The method of claim 1 further comprising:
   modifying the physical property of at least one of the source electrode and the drain electrode by doping with a predetermined implant and saliciding the drain electrode while blocking said predetermined implant and salicidation of the source electrode.

6. The method of claim 1 further comprising:
   modifying the physical property of at least one of the source electrode and the drain electrode by forming a source electrode contact to the source electrode that has less volume and surface contact area than a drain electrode contact to the drain electrode.

7. The method of claim 1 further comprising:
   modifying the physical property of at least one of the source electrode and the drain electrode by positioning the source electrode farther from the control electrode in a lateral direction than the drain electrode and control electrode are laterally separated.

8. The method of claim 1 further comprising:
   coupling a storage node to the drain electrode of the transistor to use the transistor as a load transistor;
   coupling a first power supply terminal to the transistor;
   coupling a latch transistor in series with the transistor, the latch transistor being coupled to a second power supply terminal; and
   coupling a select transistor to the storage node for coupling the storage node to a bit line in response to a control signal.

9. A method of forming a transistor comprising:
   providing a substrate;
   forming a source electrode in the substrate;
   forming a drain electrode in the substrate and lateral to the source electrode;
   forming a control electrode overlying the substrate and laterally between the source electrode and the drain electrode to form a channel between the source electrode and the drain electrode;
   modifying a physical property of at least one of the source electrode and the drain electrode to raise resistance of the source electrode to be greater than that of the drain electrode;
   forming the source electrode and the drain electrode with ion implantation to form a source implant region and a drain implant region;
   removing at least a portion of the source implant region;
   replacing the source implant region with an in-situ doped semiconductor material; and
   saliciding the in-situ doped semiconductor material to form the source electrode.

10. The method of claim 9 further comprising:
    using at least one of aluminum phosphide, gallium phosphide and zinc sulfide as the in-situ doped semiconductor material.

11. The method of claim 9 further comprising:
    modifying the physical property of at least one of the source electrode and the drain electrode by saliciding the drain electrode while blocking salicidation of the source electrode.

12. The method of claim 11 further comprising:
    implementing the source electrode and the drain electrode as implant regions having substantially the same dose and energy.

13. The method of claim 9 further comprising:
    modifying the physical property of at least one of the source electrode and the drain electrode by doping the drain electrode with a predetermined implant while blocking said implant of the source electrode.

14. The method of claim 9 further comprising:
modifying the physical property of at least one of the source electrode and the drain electrode by doping with a predetermined implant and saliciding the drain electrode while blocking said predetermined implant and salicidation of the source electrode.

15. The method of claim 9 further comprising:
modifying the physical property of at least one of the source electrode and the drain electrode by forming a source electrode contact to the source electrode that has less volume and surface contact area than a drain electrode contact to the drain electrode.

16. The method of claim 9 further comprising:
modifying the physical property of at least one of the source electrode and the drain electrode by positioning the source electrode farther from the control electrode in a lateral direction than the drain electrode and control electrode are laterally separated.

17. The method of claim 9 further comprising:
coupling a storage node to the drain electrode of the transistor to use the transistor as a load transistor;
coupling a first power supply terminal to the transistor;
coupling a latch transistor in series with the transistor, the latch transistor being coupled to a second power supply terminal; and
coupling a select transistor to the storage node for coupling the storage node to a bit line in response to a control signal.

* * * * *